(12) United States Patent
Kim

(10) Patent No.: US 11,823,930 B2
(45) Date of Patent: Nov. 21, 2023

(54) WAFER STORAGE CONTAINER AND CAP ASSEMBLY USED THEREFOR

(71) Applicant: 3S Korea Co., Ltd., Seoul (KR)

(72) Inventor: Sang Jin Kim, Gyeonggi-do (KR)

(73) Assignee: 3S Korea Co., Ltd., Seoul (KR)

( * ) Notice: Subject to any disclaimer, the term of this patent is extended or adjusted under 35 U.S.C. 154(b) by 0 days.

(21) Appl. No.: 17/885,686

(22) Filed: Aug. 11, 2022

(65) Prior Publication Data

US 2023/0317484 A1 Oct. 5, 2023

(30) Foreign Application Priority Data

Apr. 5, 2022 (KR) .......................... 10-2022-0042467

(51) Int. Cl.
*H01L 21/673* (2006.01)

(52) U.S. Cl.
CPC .. *H01L 21/67386* (2013.01); *H01L 21/67369* (2013.01); *H01L 21/67373* (2013.01); *H01L 21/67376* (2013.01); *H01L 21/67383* (2013.01)

(58) Field of Classification Search
CPC ......... H01L 21/67369; H01L 21/67386; H01L 21/67373; H01L 21/67376; H01L 21/67383; Y10S 49/02; B65D 50/045
USPC .......................... 206/710, 832, 528–540, 1.5
See application file for complete search history.

(56) References Cited

U.S. PATENT DOCUMENTS

| | | | | |
|---|---|---|---|---|
| 3,023,925 A | * | 3/1962 | Sher | B65D 39/14 29/451 |
| 4,561,544 A | * | 12/1985 | Reeve | B65D 50/045 220/345.3 |
| 5,435,455 A | * | 7/1995 | Pruss | F16B 21/08 220/787 |
| 6,732,877 B2 | * | 5/2004 | Wu | B65D 51/1616 220/300 |
| 6,854,594 B2 | * | 2/2005 | Vasudeva | B65D 50/06 215/273 |
| 7,296,730 B2 | * | 11/2007 | Erdie | B65D 59/06 229/125.17 |
| 7,681,755 B2 | * | 3/2010 | Roesler | B65D 43/021 292/303 |
| 7,909,236 B2 | * | 3/2011 | Erdie | B65D 59/02 229/125.17 |

(Continued)

FOREIGN PATENT DOCUMENTS

| | | |
|---|---|---|
| JP | S58-92546 U1 | 6/1983 |
| WO | WO 2010/017611 A1 | 2/2010 |
| WO | WO 2013/025629 A2 | 2/2013 |

*Primary Examiner* — Chun Hoi Cheung
(74) *Attorney, Agent, or Firm* — The PL Law Group, PLLC

(57) ABSTRACT

A wafer storage container and a cap assembly according to an embodiment include a storage container having a space accommodating at least one wafer therein, a fastening portion having a fastening space capable of fastening a cap, and the cap having a locking portion which is formed linearly on a first side of the cap and which has an end portion provided with a first protrusion portion, the cap being configured in a structure in which the locking portion is fastened to the fastening portion. The fastening portion includes an inner wall, and a fastening hole which is formed in a first side of the fastening portion such that the locking portion is fastened thereto. The cap includes a fixing wall in close contact with the inner wall, thereby fixing the cap to the fastening portion.

4 Claims, 5 Drawing Sheets

(56) References Cited

U.S. PATENT DOCUMENTS

| | | | | |
|---|---|---|---|---|
| 8,091,592 B2* | 1/2012 | Sato | ............... | F16K 15/063 |
| | | | | 141/98 |
| 10,388,554 B2* | 8/2019 | Gregerson | ............ | B65D 85/30 |
| 10,876,647 B2* | 12/2020 | Chiu | ............... | F16K 27/0209 |
| 2021/0061528 A1* | 3/2021 | Ting | ............... | B65D 50/046 |

* cited by examiner

WAFER STORAGE CONTAINER AND CAP ASSEMBLY USED THEREFOR

CROSS REFERENCE TO RELATED APPLICATION AND CLAIM OF PRIORITY

This application claims the benefit under 35 USC § 119 of Korean Patent Application No. 10-2022-0042467, filed on Apr. 5, 2022, in the Korean Intellectual Property Office, the entire disclosure of which is incorporated herein by reference for all purposes.

BACKGROUND

1. Field of the Invention

The present disclosure relates to a wafer storage container and a cap assembly used therefor. More specifically, the present disclosure relates to a wafer storage container having a lower portion configured to be mounted with a cap, and relates to a cap assembly used for the wafer storage container.

2. Description of the Related Art

In handling substrates such as wafers for manufacturing semiconductors, panels for manufacturing various display devices, panels for manufacturing solar cells, and so on, it is already known that protecting substrates from surrounding moisture or oxygen and from contaminants such as airborne substances is very important. Therefore, in a substrate container used in a process of storing and moving a substrate, a purging process is performed in a substrate storing space inside the substrate container by using an inert gas such as N2 gas.

Meanwhile, since a size of a substrate is getting larger recently, a size of a substrate container is also getting larger. In the field of manufacturing a display device, sizes of various flat panel display devices such as a Liquid Crystal Display (LCD), a Plasma Display Panel (PDP), an Organic Light Emitting Display (OLED), and so on are getting larger, so that a technology related to a substrate container for handling a large-area substrate such as storing and moving the large-area substrate has also been developed. For example, a detailed description will be described with reference to Korean Patent Publication No. 10-2014-0054205.

Korean Patent Publication No. 10-2014-0054205 relates to a wafer carrier. According to Korean Patent Publication No. 10-2014-0054205, a container portion has an open front surface, and a base plate secured by twist lock connectors that provide recesses for purge grommets is inserted into a bottom surface of the container portion. Further, kinematic coupling components are locked on the base plate.

However, according to Korean Patent Publication No. 10-2014-0054205 described above, caps (twist lock connectors) are mounted on a lower portion of a substrate storage container, but it is difficult to detach the caps since each cap has hook shapes on opposite sides thereof. Further, since the caps are formed in structures in which the caps are detached by applying a force at least a predetermined level of force, there is a problem that parts of the caps may be destroyed when at least the predetermined level of force is applied.

SUMMARY

Accordingly, the present disclosure has been made keeping in mind the above problems occurring in the related art, and an objective of the present disclosure is to provide a wafer storage container and a cap assembly used therefor, the wafer storage container and the cap assembly being configured such that a hook is formed only on a first surface of a cap which is mounted at a lower portion of a storage container, thereby being capable of easily attaching and detaching the cap.

In order to achieve the above objective, according to an embodiment of the present disclosure, there is provided a wafer storage container and a cap assembly used therefor, the wafer storage container and the cap assembly including: a storage container provided with a space capable of accommodating at least one wafer therein; a fastening portion formed at a lower outer side of the storage container, the fastening portion being provided with a fastening space to which a cap is capable of being fastened; and the cap having a locking portion which is formed linearly on a first side of the cap and which has an end portion thereof provided with a first protrusion portion, the cap being configured in a structure in which the locking portion is fastened to the fastening portion, wherein the fastening portion includes: an inner wall in close contact with an outer circumferential surface of the cap; and a fastening hole which is formed in a first side of the fastening portion and which is formed in a hole shape such that the locking portion is fastened thereto, and wherein the cap includes: a fixing wall which is formed on a surface facing the locking portion and which is in close contact with the inner wall, thereby fixing the cap to the fastening portion.

In addition, in the wafer storage container and the cap assembly according to an embodiment of the present disclosure, the fixing wall may include a second protrusion portion which protrudes in an inward direction and which is formed perpendicular to the fixing wall, the second protrusion portion being mounted in the inner wall.

In addition, the wafer storage container and the cap assembly according to an embodiment of the present disclosure may further include a fixing member which is formed linearly on an inner portion of the inner wall and which protrudes toward an inside of the inner wall, the fixing member being configured to be in close contact with an outer surface of the fixing wall, thereby fixing the cap to the fastening portion.

In addition, in the wafer storage container and the cap assembly according to an embodiment of the present disclosure, the cap may further include a head portion formed on upper portions of the locking portion and the fixing wall, and the head portion may include a guide portion formed at a lower portion of the head portion, the guide portion being formed on an outer circumferential surface between the locking portion and the fixing wall and being formed in a predetermined height.

In addition, in the wafer storage container and the cap assembly according to an embodiment of the present disclosure, the fastening portion may further include a close contact portion formed on an inner portion of the inner wall, the close contact portion being formed on a position that is in contact with the guide portion and being formed in a groove shape such that the guide portion is capable of being accommodated thereon.

These solutions will be more clearly understood from the following detailed description of the present disclosure when taken in conjunction with the accompanying drawings.

Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

That is, according to an embodiment of the present disclosure, since the locking portion is formed only on the first side of the cap, the cap has a structure in which the cap is fixed to only one side (a part corresponding to the locking portion) and the cap is supported on other side (a part corresponding to the fixing wall), so that an improved structure capable of enabling easy attaching and detaching of the cap may be realized.

In addition, according to an embodiment of the present disclosure, since the fastening portion and the cap have simple and concise structures, cost for molds may be reduced.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
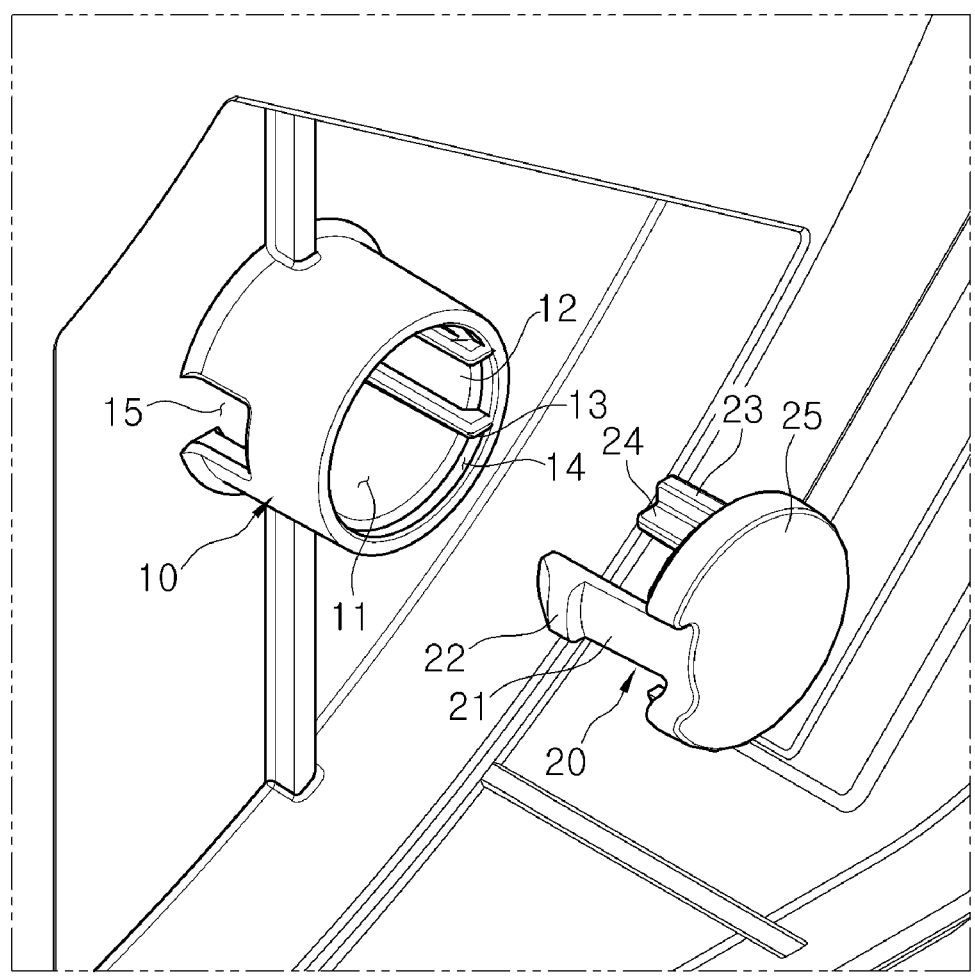
FIG. 1 is a perspective view illustrating an assembled state of a wafer storage container and a cap assembly used therefor according to an embodiment of the present disclosure.

The specific viewpoints and specific technical features of the present disclosure will become apparent from the following specific description and an embodiment related to the accompanying drawings. In the present specification, in relation to adding reference numerals to elements of each drawing, the same elements have the same reference numerals although they are indicated on different drawings. In addition, in describing an embodiment of the present disclosure, when it is determined that a detailed description of a related known configuration or function may make the subject matter of the present disclosure unclear, a detailed description thereof will be omitted.

In addition, in describing the components of the present disclosure, terms such as first, second, A, B, (a), and (b) may be used. These terms are only used to distinguish one component from another component, and the nature, sequence, or order of the corresponding component is not limited by the terms. When a component is described as being "connected", "coupled", or "linked" to another component, the component may be directly connected or linked to the other component, or other components may be "connected", "coupled", or "linked" to therebetween.

Hereinafter, an embodiment of the present disclosure will be described in detail with reference to the accompanying drawings.

Figure 2:
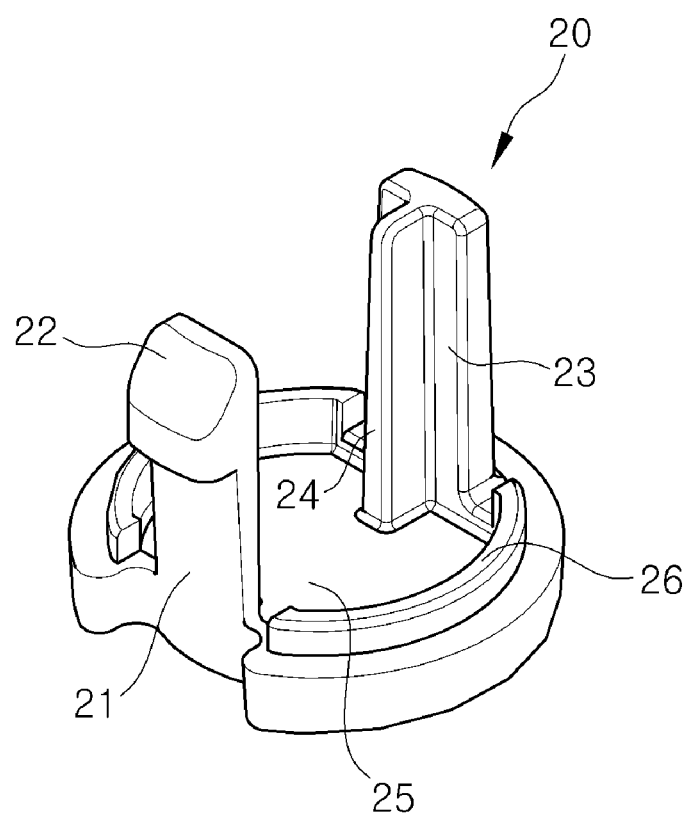
FIG. 2 is a perspective view illustrating a cap of the cap assembly according to an embodiment of the present disclosure.
Figure 3:
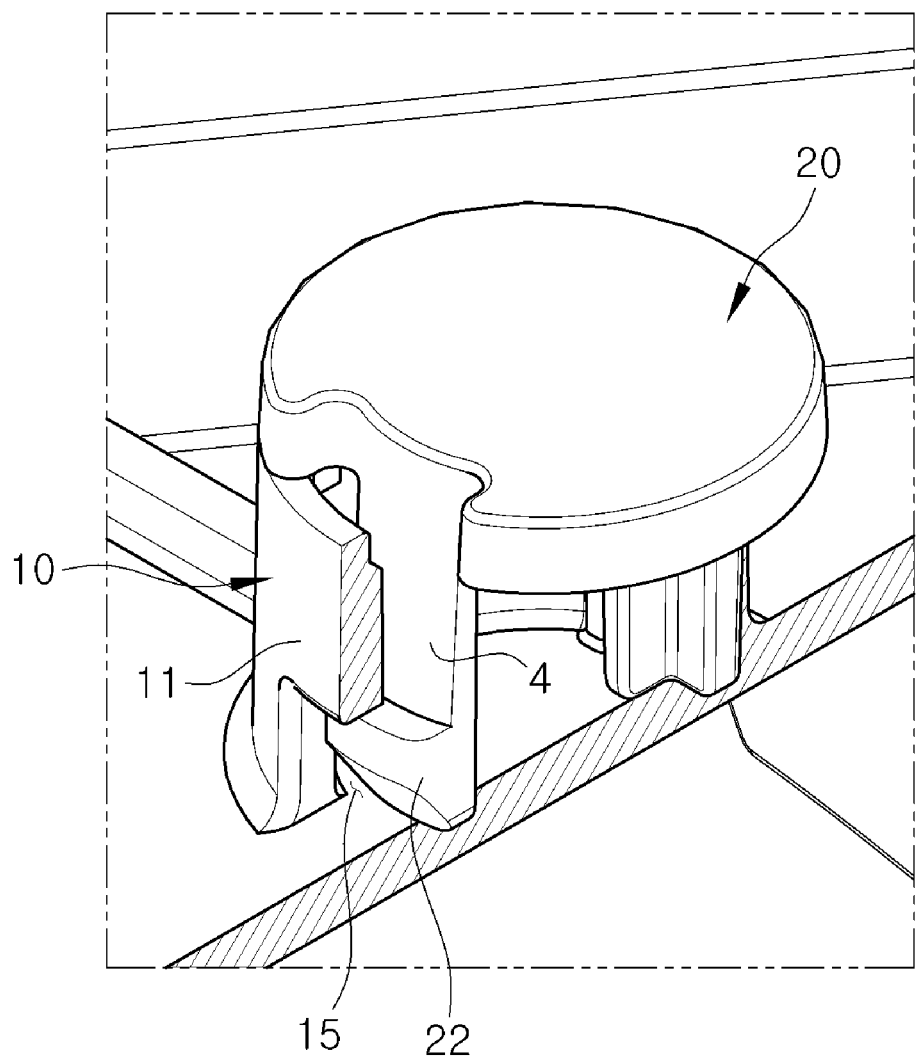
FIG. 3 is a partial perspective view illustrating a mounted state of the wafer storage container and the cap assembly used therefor according to an embodiment of the present disclosure.
Figure 4:
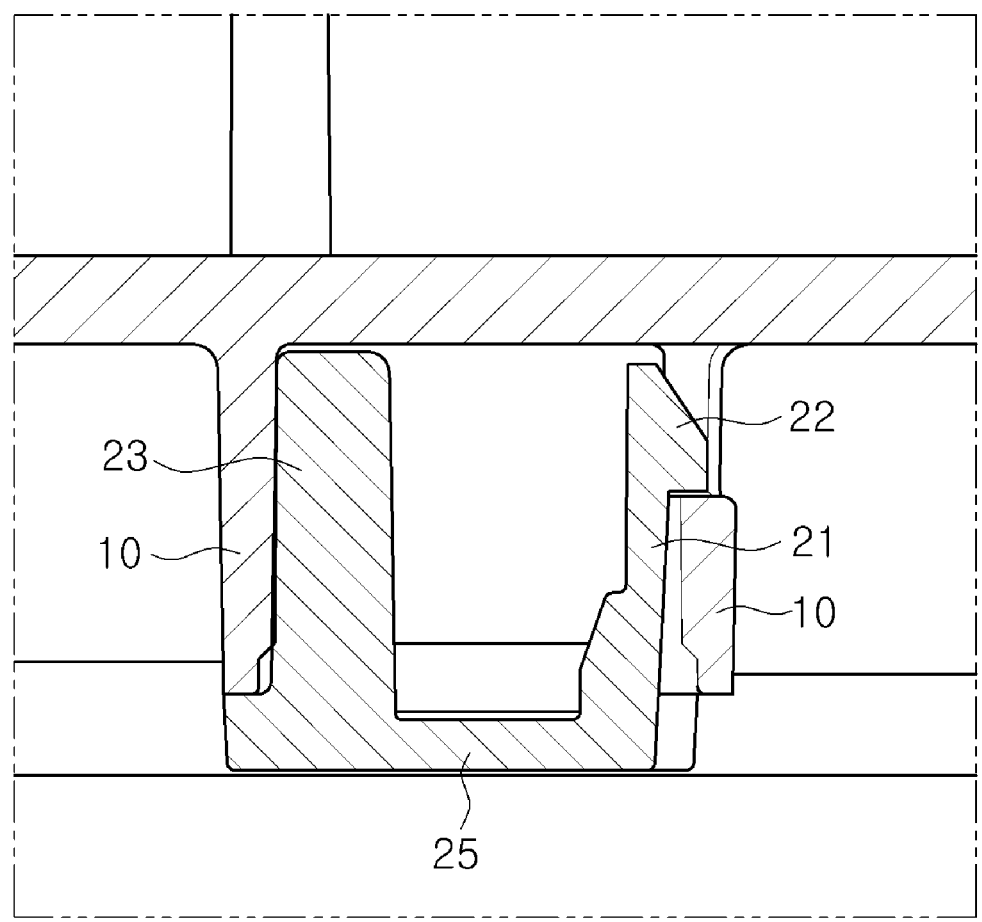
FIGS. 4 and 5 are cross-sectional views illustrating a state in which the wafer storage container and the cap assembly used therefor according to an embodiment of the present disclosure are mounted with each other.
Figure 5:
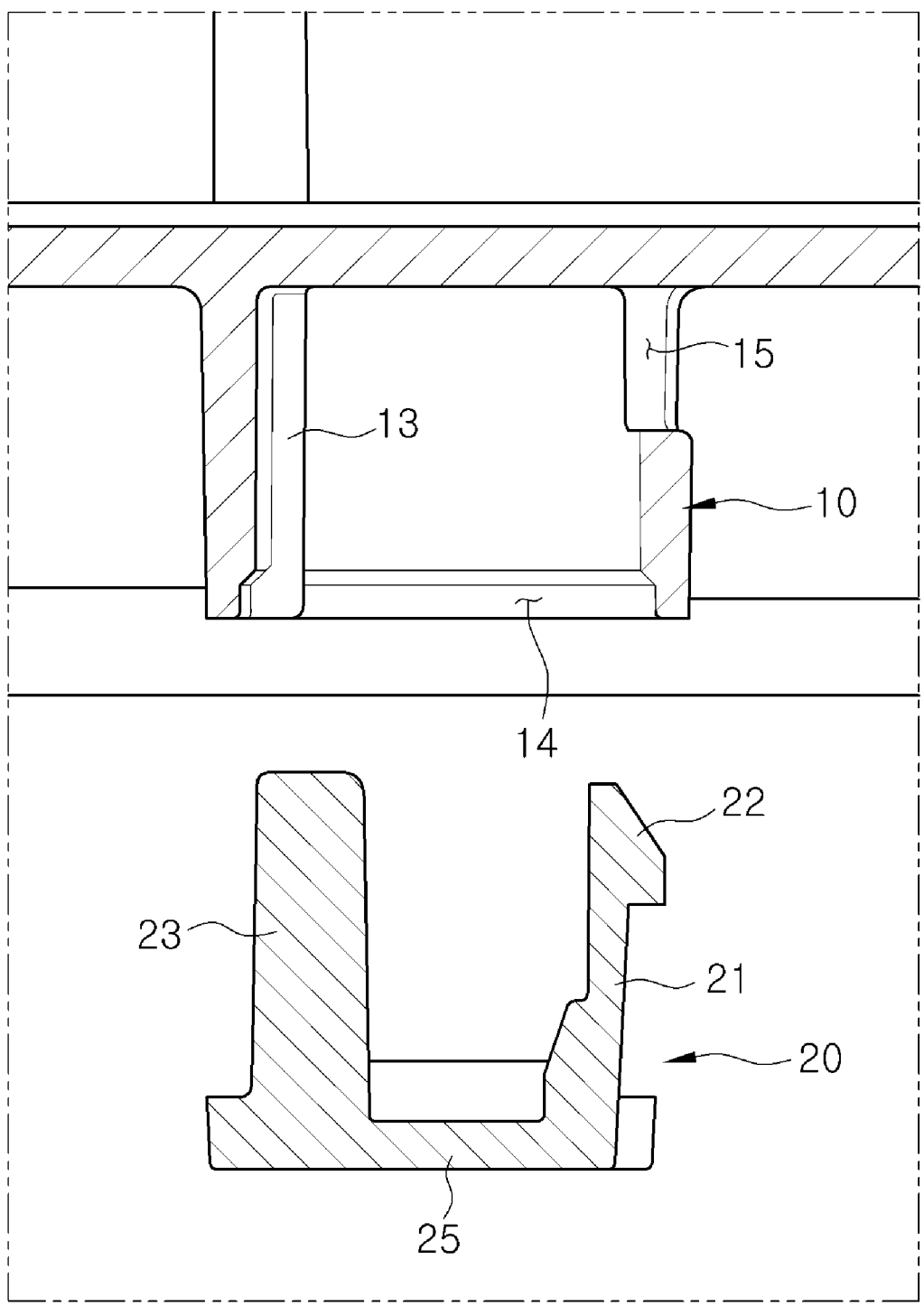

As illustrated in FIGS. 1 to 5, a wafer storage container and a cap assembly used therefor according to an embodiment of the present disclosure may include a storage container 1 which has an inner portion provided with a space for accommodating at least one wafer therein and which has a first surface capable of being open, a fastening portion 10 which is formed on a lower outer side of the storage container 1 and which is provided with a fastening space 11 that is capable of fastening a cap 20, and the cap 20 inserted into and mounted at the fastening portion 10.

The storage container 1 may have the space formed therein such that at least one wafer is capable of being stacked and accommodated in the space, and may be formed such that the first surface thereof is capable of being open. Further, the storage container 1 may be configured such that the storage container 1 is capable of being open and closed by mounting a separate door apparatus (not illustrated) on an open surface.

The fastening portion 10 provided with the fastening space 11 to which the cap 20 is capable of being fastened may be provided on the lower outer side of such a storage container 1.

The fastening portion 10 has an inner wall 12. Further, the inner wall 12 may have a structure in which the fastening space 11 is provided inside the inner wall 12 and the cap 20 is mounted at the fastening space 11.

Such a fastening portion 10 may be configured such that a fastening hole 15 is formed in a first side of the fastening portion 10, so that the cap 20 is capable of being fastened to the fastening portion 10 by fixing a locking portion 21 which is formed on the cap 20 to the fastening hole 15.

In addition, the fastening portion 10 may further include a fixing member 13. Further, the fixing member 13 is formed linearly on an inner portion of the inner wall 12, protrudes toward an inside of the inner wall 12, and is configured to be in close contact with an outer surface of a fixing wall 23, so that the fixing member 13 performs a function of fixing the cap 20 to the inside of the fastening portion 10.

Since the fixing member 13 is formed on the inner portion of the inner wall 12 and the fixing wall 23 of the cap 20 is seated on the fixing member 13, an effect of preventing the cap 20 from separating from the fastening portion 10 to the outside may be expected.

In addition, the fastening portion 10 may further include a close contact portion 14 which is formed in a groove shape in an inward direction in an end portion inside the inner wall 12 and which performs a function of accommodating a guide portion 26 of the cap 20, in which the guide portion 26 will be described later.

The cap 20 may include the locking portion 21 which is formed on a first side of the cap 20 and which is fastened to the fastening hole 15, the fixing wall 23 which is formed on a surface facing the locking portion 21 and which is formed to be in close contact with the inner wall 12, and a head portion 25 positioned on upper portions of the locking portion 21 and the fixing wall 23.

The locking portion 21 may be formed on the first side of the cap 20, may have a first protrusion portion 22 formed in a hook shape which protrudes in an outward direction on an end portion of the locking portion 21, and may have a structure in which the first protrusion portion 22 is fastened to the fastening hole 15.

The fixing wall 23 may further include a second protrusion portion 24. Further, the second protrusion 24 is formed linearly on the surface facing the locking portion 21, has a structure in which the outer surface of the fixing wall 23 is in close contact with and fixed to the fixing member 13, and has a protrusion shape formed perpendicular to an inward direction of the fixing wall 23.

The second protrusion portion 24 may perform a function of preventing deformation or damage to a structure of the fixing wall 23 even if the fixing wall 23 is in close contact with the fixing member 13 which protrudes in the inward direction from the inner wall 12 for a long time. In addition, even if the fixing wall 23 is in close contact with the fixing member 13, the second protrusion portion 24 further applies a predetermined fixing force to the fixing wall 23, so that the fixing wall 23 may be more rigidly fixed to the fixing member 13.

The head portion 25 is positioned at an upper portion of the cap 20. More specifically, the head portion 25 is formed between the locking portion 21 and the fixing wall 23, is positioned at the upper portions of the locking portion 21 and the fixing wall 23, and is formed in a shape corresponding to the fastening portion 10. For example, when a shape of the head portion 25 is a circular shape, the fastening space 11 of the fastening portion 10 may be formed in the same circular shape so that the head portion 25 is capable of being rigidly fixed to the fastening space 11.

Such a head portion 25 may further include the guide portion 26. Further, the guide portion 26 is formed at a lower portion of the head portion 25, is formed at an outer circumferential surface between the locking portion 21 and the fixing wall 23, and is formed in a predetermined height.

When cap 20 is inserted into and fastened to the fastening portion 10, the guide portion 26 is seated on the close contact portion 14, so that an effect that the cap 20 is prevented from separating to the outside may be expected.

That is, according to an embodiment of the present disclosure, since the locking portion 21 is formed only on the first side of the cap 20, the cap 20 has a structure in which the cap 20 is fixed to only one side (a part corresponding to the locking portion) and the cap 20 is supported on other side (a part corresponding to the fixing wall), so that an improved structure capable of enabling easy attaching and detaching of the cap 20 may be realized.

In addition, according to an embodiment of the present disclosure, since the fastening portion 10 and the cap 20 have simple and concise structures, cost for molds may be reduced.

Hereinbefore, the present disclosure has been described in detail using an embodiment. However, the embodiment is provided herein only to describe the present disclosure in detail, and the wafer storage container and the cap assembly used therefor according to the present disclosure are not limited thereto. The terms such as "includes", "forms", or "comprises" described above mean that a corresponding component may be included unless stated otherwise, and, accordingly, other components may be further included, not excluded. All terms, including technical or scientific terms, unless defined otherwise, have the same meaning as commonly understood by one of ordinary skill in the technical field to which the present disclosure belongs.

In addition, although the embodiment of the present disclosure has been disclosed for illustrative purposes, those skilled in the art will appreciate that various modifications, additions and substitutions are possible, without departing from the scope and spirit of the present disclosure. Accordingly, embodiments and the accompanying drawings disclosed in the present disclosure are provided for describing the present disclosure and are not intended to limit the technical ideas of the present disclosure. The technical ideas of the present disclosure are not limited to the embodiments and the drawings. The scope of the present disclosure should be construed as being covered by the scope of the appended claims, and all technical ideas falling within the scope of the claims should be construed as being included in the scope of the present disclosure.

What is claimed is:

1. A wafer storage container and a cap used therefor, the wafer storage container and the cap comprising:
    a storage container provided with a space capable of accommodating at least one wafer therein;
    a fastening portion formed at a lower outer side of the storage container, the fastening portion being provided with a fastening space; and
    the cap configured for being fastened to the fastening space, the cap having a locking portion which is formed linearly on a first side of the cap and which has an end portion thereof provided with a first protrusion portion, the cap being configured in a structure in which the locking portion is fastened to the fastening portion,
    wherein the fastening portion comprises:
        an inner wall in close contact with an outer circumferential surface of the cap; and
        a fastening hole which is formed in a first side of the fastening portion and which is formed in a hole shape such that the locking portion is fastened thereto, and
    wherein the cap comprises:
        a fixing wall which is formed on a surface facing the locking portion and which is in close contact with the inner wall, thereby fixing the cap to the fastening portion,
    wherein the fixing wall comprises a second protrusion portion which protrudes in an inward direction and which is formed perpendicular to the fixing wall, the second protrusion portion being mounted in an inner surface of the fixing wall.

2. The wafer storage container and the cap assembly of claim 1, further comprising a fixing member which is formed linearly on an inner portion of the inner wall and which protrudes toward an inside of the inner wall, the fixing member being configured to be in close contact with an outer surface of the fixing wall, thereby fixing the cap to the fastening portion.

3. A wafer storage container and a cap used therefor, the wafer storage container and the cap comprising:
    a storage container provided with a space capable of accommodating at least one wafer therein;
    a fastening portion formed at a lower outer side of the storage container, the fastening portion being provided with a fastening space; and
    the cap configured for being fastened to the fastening space, the cap having a locking portion which is formed linearly on a first side of the cap and which has an end portion thereof provided with a first protrusion portion, the cap being configured in a structure in which the locking portion is fastened to the fastening portion,
    wherein the fastening portion comprises:
        an inner wall in close contact with an outer circumferential surface of the cap; and
        a fastening hole which is formed in a first side of the fastening portion and which is formed in a hole shape such that the locking portion is fastened thereto, and
    wherein the cap comprises:
        a fixing wall which is formed on a surface facing the locking portion and which is in close contact with the inner wall, thereby fixing the cap to the fastening portion, wherein the cap further comprises a head portion formed on upper portions of the locking portion and the fixing wall, and the head portion comprises a guide portion formed at a lower portion of the head portion, the guide portion being formed on an outer circumferential surface between the locking portion and the fixing wall and being formed in a predetermined height.

4. The wafer storage container and the cap assembly of claim 3, wherein the fastening portion further comprises a close contact portion formed on an inner portion of the inner wall, the close contact portion being formed on a position that is in contact with the guide portion and being formed in a groove shape such that the guide portion is capable of being accommodated thereon.

* * * * *